US010090992B2

(12) United States Patent
Polster et al.

(10) Patent No.: US 10,090,992 B2
(45) Date of Patent: *Oct. 2, 2018

(54) INJECTION LOCKED CLOCK RECEIVER

(71) Applicant: Commissariat à l'Énergie Atomique et aux Énergies Alternatives, Paris (FR)

(72) Inventors: Robert Polster, Berlin (DE); José-Luis Gonzalez Jimenez, Voreppe (FR); Ivan Miro Panades, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 197 days.

This patent is subject to a terminal disclaimer.

(21) Appl. No.: 15/087,991

(22) Filed: Mar. 31, 2016

(65) Prior Publication Data

US 2016/0294540 A1   Oct. 6, 2016

(30) Foreign Application Priority Data

Apr. 2, 2015 (FR) .................................. 15 52872

(51) Int. Cl.
*H04L 7/00* (2006.01)
*H03K 3/03* (2006.01)
(Continued)

(52) U.S. Cl.
CPC ........... *H04L 7/0075* (2013.01); *H03D 13/00* (2013.01); *H03K 3/037* (2013.01); *H03K 3/0315* (2013.01); *H04L 7/0087* (2013.01); *H03K 5/133* (2013.01)

(58) Field of Classification Search
CPC ....... H03K 3/0315; H03K 2005/00286; H03K 5/26; H03K 3/0337; H03K 5/19;
(Continued)

(56) References Cited

U.S. PATENT DOCUMENTS 5,345,186 A * 9/1994 Lesmeister ...... G01R 31/31709
327/105
5,521,736 A * 5/1996 Swirhun .............. H04B 10/803
398/154
(Continued)

FOREIGN PATENT DOCUMENTS

WO     WO 94/17592 A1    8/1994

OTHER PUBLICATIONS

Gangasani, Gautam Reddy, and Peter R. Kinget. "Time-domain model for injection locking in nonharmonic oscillators." IEEE Transactions on Circuits and Systems I: Regular Papers55.6 (2008): 1648-1658.*

(Continued)

*Primary Examiner* — Jaweed A Abbaszadeh
*Assistant Examiner* — Brian J Corcoran
(74) *Attorney, Agent, or Firm* — Wolf, Greenfield & Sacks, P.C.

(57) ABSTRACT

A clock receiver including: a ring oscillator adapted to generate a clock signal, the ring oscillator having a sequence of N inverters, an input of a first inverter being coupled to a feedback node, an input of a second inverter being connected to an output of the first inverter and to an input line for receiving a reference clock signal, and an output of the second inverter or of a third inverter providing a first phase signal; a further sequence of inverters, an input of a first further inverter being coupled to the feedback node, and an output of another further inverter providing a second phase signal; and a control circuit for adjusting an oscillation frequency of the ring oscillator based on the relative phases of the first and second phase signals.

20 Claims, 3 Drawing Sheets

(51) Int. Cl.
*H03D 13/00* (2006.01)
*H03K 3/037* (2006.01)
*H03K 5/133* (2014.01)

(58) Field of Classification Search
CPC ....... H03L 7/0995; H03L 7/24; H03L 7/0812; H03L 7/095; G11C 29/023; G11C 29/50012; H03B 2201/038; H03B 27/00; H04B 10/07; H04B 10/6911; H03D 13/00; H04L 7/0075; H04L 7/0087
See application file for complete search history.

(56) References Cited

U.S. PATENT DOCUMENTS

| | | | | |
|---|---|---|---|---|
| 5,635,864 | A * | 6/1997 | Jones | H03K 5/24 327/63 |
| 6,188,291 | B1 | 2/2001 | Gopinathan et al. | |
| 6,774,689 | B1 * | 8/2004 | Sudjian | H03L 7/0812 327/158 |
| 8,841,948 | B1 | 9/2014 | Chien | |
| 8,860,513 | B1 * | 10/2014 | Chong | H03K 3/0322 331/172 |
| 9,444,435 | B1 * | 9/2016 | Monaco | H03K 3/0322 |
| 2003/0062956 | A1 | 4/2003 | Rombach et al. | |
| 2010/0316391 | A1 * | 12/2010 | Shastri | H04B 10/801 398/141 |
| 2012/0098690 | A1 * | 4/2012 | Dinc | H03K 3/011 341/155 |
| 2013/0058384 | A1 * | 3/2013 | Otis | G06F 7/68 375/219 |
| 2015/0137895 | A1 * | 5/2015 | Raj | H03B 27/00 331/25 |

OTHER PUBLICATIONS

Search Report, dated Feb. 4, 2016, from corresponding French Application No. 15/52872.
Jindal: "Silicon MOS Amplifier Operation in the Integrate and Dump Mode for Gigahertz Band Lightwave Communication Systems," (1990) Journal of Lightwave Technology; vol. 7; pp. 1023-1026.
Leu et al.: "Injection-Locked Clock Receiver for Monolithic Optical Link in 45nm SOI," (2011) IEEE Asian Solid State Circuits Conference; pp. 149-152.
Gathman et al.: "A 45-nm SOI CMOS Integrate-and-Dump Optical Sampling Receiver," (2013) IEEE Transactions on Circuits and Systems; pp. 469-478.
Sam et al.: "Variation Issues in On-Chip Optical Distribution," (2001) IEEE; pp. 64-67.
Bhatnagar: "Receiverless detection schemes for optical clock distribution," (2004) Proceedings of SPIE—The International Society for Optical Engineering; pp. 352-359.

* cited by examiner

INJECTION LOCKED CLOCK RECEIVER

CROSS-REFERENCE TO RELATED APPLICATIONS

This application claims the priority benefit of French patent application number 15/52872, filed on Apr. 2, 2015, which is hereby incorporated by reference in its entirety to the maximum extent allowable by law.

FIELD

The present disclosure relates to the field of clock receivers, and in particular to a clock receiver comprising a ring oscillator.

BACKGROUND

Optical links provide high data transmission rates at low power, and thus present a viable solution for replacing ordinary copper interconnects between integrated circuits. Optical reception is based on capturing, using a photosensitive device such as a photodiode, a light signal that is generally encoded in a digital fashion, and which may have a power level as low as 10 µW. The photosensitive device for example generates a small current that is transformed by the optical receiver into a digital voltage signal.

In order to correctly receive a data signal transmitted optically over such an optical link, it is generally necessary to receive a timing signal over the optical link. In some embodiments, the timing signal may be extracted from the data signal itself, but such solutions tend to be complex to implement. Indeed, the data encoding will generally mean that a timing edge is not present in the data signal for each data bit of the data transmitted over the link.

In order to generate a clock signal on the receive side based on a low power clock transmission, it has been proposed to use an injection-locked solution. Such a solution uses a ring oscillator oscillating at a given frequency. The received low power clock signal is injected at a node of the ring oscillator in order to modify its oscillation frequency to the desired frequency as defined by the clock signal.

A difficulty is that, due to process variations, the natural oscillating frequency of the ring oscillator may in some cases be relatively far from the desired frequency. Thus the injection of the low power clock signal may not be enough to bring the oscillation frequency of the ring oscillator to a desired frequency. A solution could be to increase the power of the transmitted clock signal, but this would lead to increased power consumption.

SUMMARY

It is an aim of embodiments of the present disclosure to at least partially address one or more difficulties in the prior art.

According to one aspect, there is provided a clock receiver comprising: a ring oscillator adapted to generate a clock signal, the ring oscillator comprising a sequence of N inverters, where N is an odd integer equal to 3 or more, an input of a first inverter of the ring oscillator being coupled to a feedback node of the ring oscillator, an input of a second inverter of the ring oscillator being connected to an output of the first inverter and to an input line for receiving a reference clock signal, and an output of the second inverter or of a third inverter of the sequence providing a first phase signal; a further sequence of two or more further inverters, an input of a first further inverter being coupled to the feedback node of the ring oscillator, and an output of another further inverter of the further sequence providing a second phase signal; and a control circuit for adjusting an oscillation frequency of the ring oscillator based on the relative phases of the first and second phase signals.

According to one embodiment, the control circuit is further adapted to control a phase delay introduced by the further sequence of inverters based on the relative phases of the first and second phase signals.

According to one embodiment, the signal at the feedback node is delayed by M inverters of the sequence of N inverters to generate the first phase signal; and the signal at the feedback node is delayed by M further inverters of the further sequence of inverters to generate the second phase signal.

According to one embodiment, the control circuit comprises an early-late detector comprising: a bi-stable storage device formed of a pair of inverters cross-coupled between first and second output nodes of the early-late detector; at least one first switch coupled between the first and second output nodes and controlled based on the first and second phase signals; a second switch controlled based on the first phase signal and coupled between the first node and a first supply voltage rail; and a third switch controlled based on the second phase signal and coupled between the second node and the first supply voltage rail.

According to one embodiment, the at least one first switch comprises a pair of first switches coupled in series between the first and second output nodes, a first switch of the pair being controlled based on the first phase signal, and a second switch of the pair being controlled based on the second phase signal.

According to one embodiment, the clock receiver further comprises a circuit for unbalancing the bi-stable storage device comprising a first capacitor selectively coupled to the first node by a fourth switch and a second capacitor selectively coupled to the second node by a fifth switch.

According to one embodiment, the fourth switch is rendered conductive by a first state of the first or second phase signal, and the fifth switch is rendered conductive by a second state of the first or second phase signal.

According to one embodiment, the control circuit further comprises a low pass filter adapted to generate at least one frequency correction signal, wherein the low pass filter is adapted not to generate the frequency correction signal if the early-late detector detects a changing sign of phase difference between the first and second phase signals over consecutive periods of the first phase signal.

According to one embodiment, at least one of the inverters of the ring oscillator comprises a transistor having a back gate, the control circuit adjusting the oscillation frequency of the ring oscillator by controlling the voltage applied to the back gate.

According to one embodiment, the ring oscillator further comprises a transistor coupled by its main conducting nodes between adjacent inverters of the ring oscillator, the control circuit adjusting the oscillation frequency of the ring oscillator by controlling the voltage applied to a control node of the transistor.

According to one embodiment, the ring oscillator further comprises a transistor coupled by its main conducting nodes between a transistor of one of the inverters of the ring oscillator and a supply voltage rail, the control circuit adjusting the oscillation frequency of the ring oscillator by controlling the voltage applied to a control node of the transistor.

According to one embodiment, the frequency of the ring oscillator is controlled by a voltage signal, the control circuit further comprising a charge pump adapted to generate the voltage signal.

According to a further aspect, there is provided an optical link comprising: an optical receiver comprising a first photosensitive device adapted to receive an optical transmission of a data signal; and the above clock receiver comprising a second photosensitive device adapted to receive an optical transmission of the reference clock signal and coupled to the input line.

According to a further aspect, there is provided a method of clock reception comprising: receiving, on an input line, a reference clock signal; injecting the reference clock signal into a ring oscillator comprising a sequence of N inverters, where N is an odd integer equal to 3 or more, a first of the inverters being coupled to a feedback node of the ring oscillator, the reference clock signal being injected at the input of a second of the inverters of the ring oscillator connected to an output of the first inverter; generating by the ring oscillator a first phase signal at an output of the second inverter or of a third inverter of the sequence; generating by a further sequence of two or more inverters, a second phase signal, an input of a first further inverter of the further sequence being connected to the feedback node of the ring oscillator, and an output of another further inverter of the further sequence providing the second phase signal; and adjusting, by a control circuit, an oscillation frequency of the ring oscillator based on the relative phases of the first and second phase signals.

According to one embodiment, the method further comprises adjusting, by the control circuit, a phase delay introduced by the further sequence of inverters based on the relative phases of the first and second phase signals.

According to one embodiment, the signal at the feedback node is delayed by M inverters of the sequence of N inverters to generate the first phase signal; and the signal at the feedback node is delayed by M further inverters of the further sequence of inverters to generate the second phase signal.

According to one embodiment, detecting the relative phases of the first and second phase signals comprises using an early-late detector comprising a bi-stable storage device formed of a pair of inverters cross-coupled between first and second output nodes of the early-late detector to: render non-conductive, based on the first and second phase signals, at least one first switch coupled between the first and second output nodes; control a second switch of the early-late detector based on the first phase signal, the second switch being coupled between the first node and a first supply voltage rail; and control a third switch of the early-late detector based on the second phase signal, the third switch being coupled between the second node and the first supply voltage rail.

According to a further aspect of the present disclosure, there is provided an early-late detector for detecting the sign of a phase difference between first and second timing signals comprising: a bi-stable storage device formed of a pair of inverters cross-coupled between first and second nodes of the early-late detector; at least one first switch coupled between the first and second output nodes and controlled based on the first and second timing signals; a second switch coupled between the first node and a first supply voltage rail; and a third switch coupled between the second node and the first supply voltage rail.

According to one embodiment, the at least one first switch comprises a pair of first switches coupled in series between the first and second output nodes, a first switch of the pair being controlled based on the first phase signal, and a second switch of the pair being controlled based on the second phase signal.

According to one embodiment, the clock receiver further comprises a circuit for unbalancing the bi-stable storage device comprising a first capacitor selectively coupled to the first node by a fourth switch and a second capacitor selectively coupled to the second node by a fifth switch.

According to one embodiment, the fourth switch is rendered conductive by a first state of the first or second phase signal, and the fifth switch is rendered conductive by a second state of the first or second phase signal.

According to a further aspect, there is provided a method of detecting the relative phases of first and second timing signals using an early-late detector comprising a bi-stable storage device formed of a pair of inverters cross-coupled between first and second output nodes of the early-late detector, the method comprising: rendering non-conductive, based on the first and second timing signals, at least one first switch coupled between the first and second output nodes; controlling a second switch of the early-late detector based on the first timing signal, the second switch being coupled between the first node and a first supply voltage rail; and controlling a third switch of the early-late detector based on the second timing signal, the third switch being coupled between the second node and the first supply voltage rail.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the present description, the term "connected" is used to designate a direct electrical connection between two elements, whereas the term "coupled" is used to designate an electrical connection between two elements that may be direct, or may be via one or more other components such as resistors, capacitors or transistors. Furthermore, as used herein, the term "substantially" is used to designate a range of +/−10 percent of the value in question.

Furthermore, in the following description, embodiments are described that are directed to a clock receiver of an optical link. However, it will be apparent to those skilled in the art that the embodiments described herein could be applied to the reception of clock signals transmitted by other means than an optical link. For example, the embodiments described herein could be applied to the reception of an electrical clock signal transmitted over a transmission line between chips. The transmission line could be long and/or susceptible to perturbations caused by cross-talk, leading to a need to regenerate the clock signal on the receive side.

Figure 1:
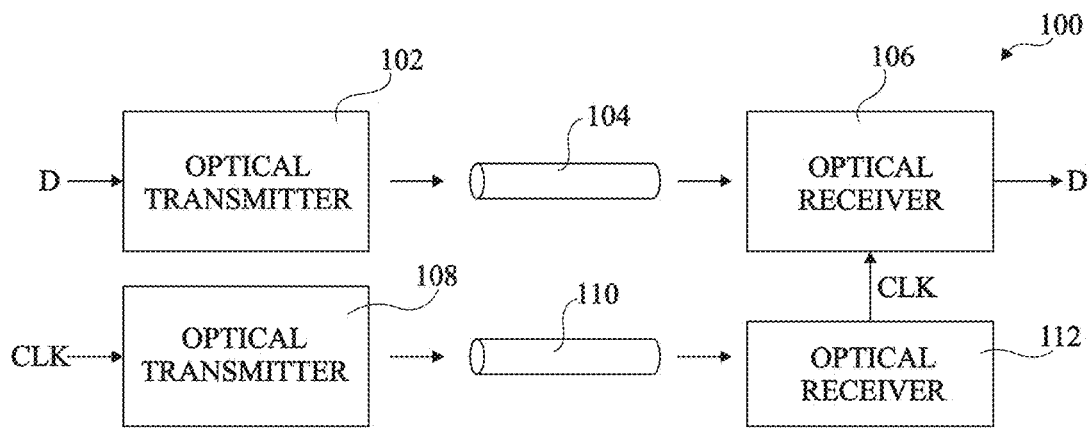
FIG. 1 schematically illustrates an optical link according to an example embodiment.

FIG. 1 schematically illustrates an optical link 100. As illustrated, on a transmission side, a data signal D is converted by an optical transmitter (OPTICAL TRANSMITTER) 102 into an optical signal, which is transmitted via a waveguide 104 to reception side of the optical link. On the reception side, the optical signal is received by an optical receiver (OPTICAL RECEIVER) 106, which converts the optical signal back into the data signal D. To do so, it uses a clock signal CLK, which is transmitted via a separate clock channel of the optical link. In particular, on the transmission side, a clock signal CLK is converted into an optical signal by a further optical transmitter (OPTICAL TRANSMITTER) 108. This optical signal is transmitted by a further waveguide 110 to the reception side, where it is received by a further optical receiver (OPTICAL RECEIVER) 112, and reconverted into a voltage signal CLK, which is provided to the optical receiver 106 to enable the optical data signal to be correctly received.

The optical receiver 112 uses an injection locking reception technique, as will now be described in more detail.

Figure 2:
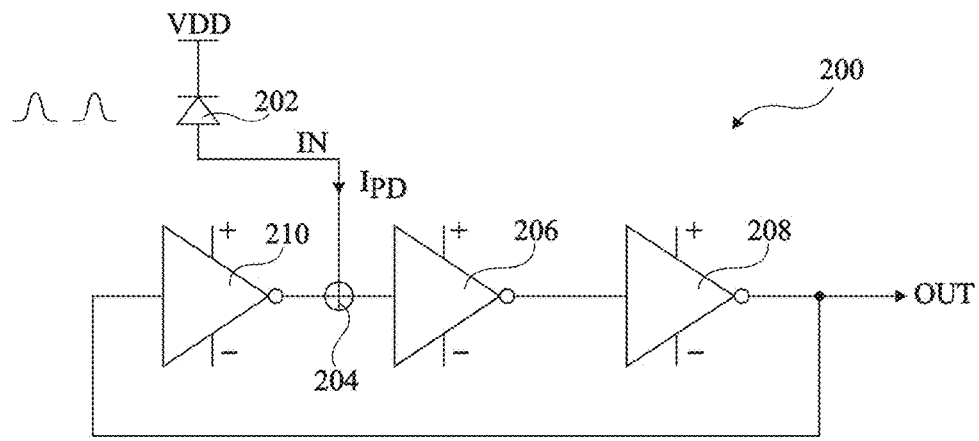
FIG. 2 schematically illustrates an optical receiver for receiving an optical clock signal according to an example embodiment.

FIG. 2 schematically illustrates a clock receiver 200 based on injection locking. As illustrated, a photodiode 202 for example has its cathode coupled to a supply rail VDD, and its anode coupled to an injection node 204 of a ring oscillator. The ring oscillator for example comprises inverters 206, 208 and 210 coupled in a loop, the input of the inverter 206 being coupled to the input node 204, and the output of the inverter 208 being coupled to the input of inverter 210, and providing an output signal OUT of the ring oscillator.

Figure 3:
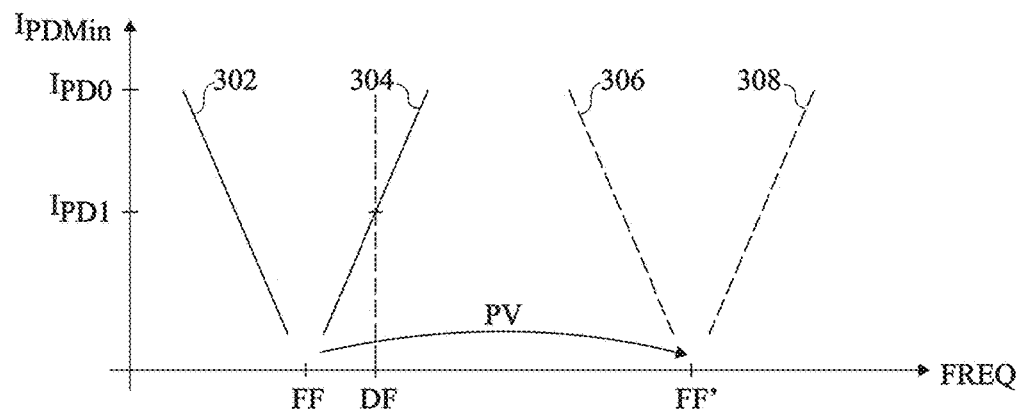
FIG. 3 is a frequency diagram representing a minimum photodiode current for bringing the frequency of the ring oscillator of FIG. 2 to a desired level according to an example embodiment.

FIG. 3 is a frequency diagram illustrating an example of the minimum photodiode current IPD Min required to change the frequency of the ring oscillator of FIG. 2 from its natural frequency FF to a desired frequency DF. As represented by solid lines 302 and 304 in FIG. 3, if a desired frequency DF is within a certain range of the natural frequency FF of the ring oscillator, a photodiode current IPD0 is sufficient to bring the frequency to the desired frequency DF. The required current is greater the further the desired frequency DF is from the natural frequency FF. An example is represented in FIG. 3 in which a desired frequency DF is only slightly higher than the frequency FF of the ring oscillator, and thus in this example a photodiode current IPD1, lower than IPD0, is sufficient to bring the frequency of the ring oscillator from the frequency FF to the desired frequency DF.

Dashed lines 306 and 308 in FIG. 3 represent the current required to adjust the ring oscillator in the case that, due to process variations PV, the natural frequency of the ring oscillator is at very different frequency FF' to the frequencies FF and DF. In such a case, the desired frequency DF does not fall within the range of values covered by the lines 306 and 308 on each side of the frequency FF', and thus the current IPD0 is no longer sufficient to bring the oscillating frequency of the ring oscillator to the desired frequency DF.

Figure 4:
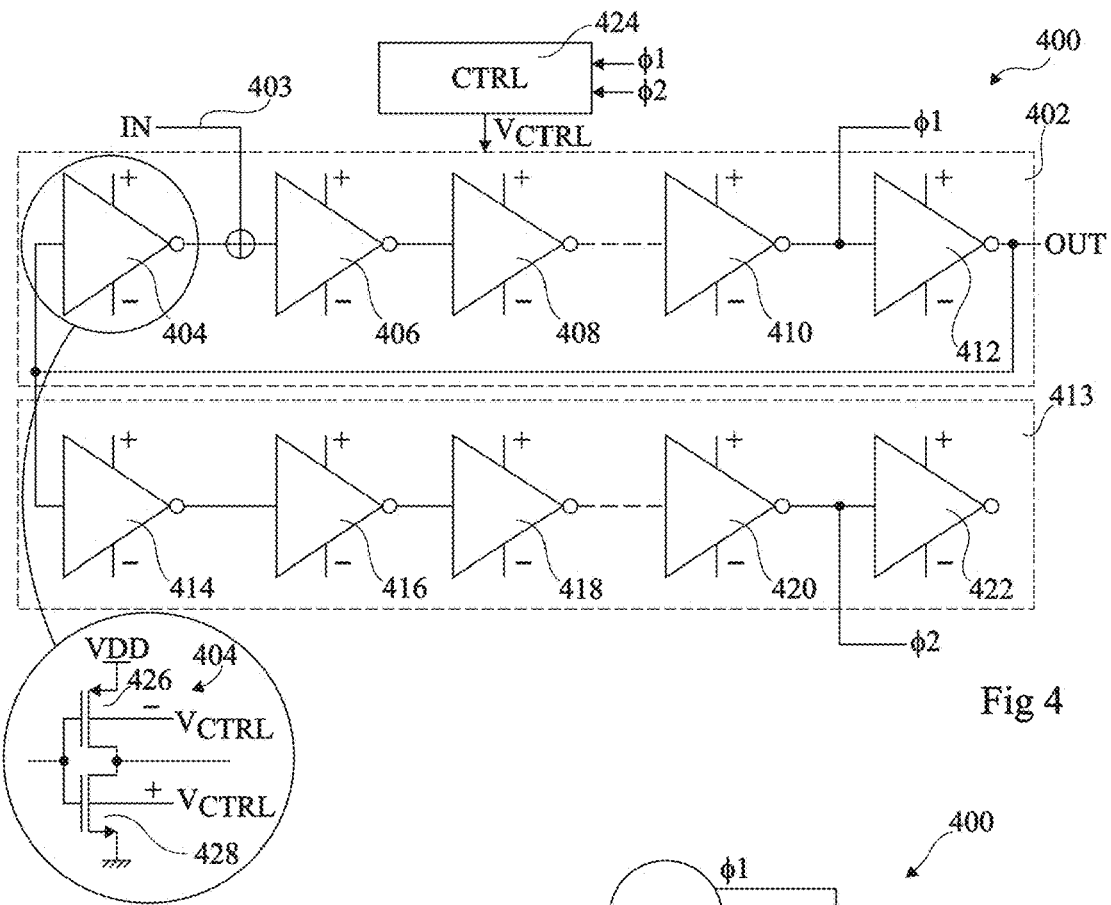
FIG. 4 schematically illustrates a clock receiver according to an example embodiment of the present disclosure.

FIG. 4 illustrates a clock receiver 400 based on a ring oscillator according to an example embodiment of the present disclosure. This circuit is capable of detecting a frequency correction to be applied to the ring oscillator, and of applying this frequency correction to change the natural oscillating frequency of the ring oscillator.

The clock receiver 400 for example comprises a ring oscillator 402 comprising N inverters coupled in a loop, N being an odd integer equal to at least three. An input line 403 provides a reference clock signal IN to a node of the ring oscillator. This input signal is for example generated by a photodiode receiving an optical clock signal, in a similar fashion to the photodiode 202 in FIG. 2. Alternatively, as mentioned above, the circuit of FIG. 4 could be used for the reception of other types of clock signals, such as electrical clock signals transmitted between chips.

In the example FIG. 4, there are five inverters 404, 406, 408, 410 and 412 coupled in the ring. The input line 403 is for example coupled to the input of the inverter 406. The output of the inverter 410 for example provides a phase signal $\phi 1$. The output of the inverter 412 forms a feedback node of the ring oscillator which is coupled to the input of the inverter 404. In the example of FIG. 4, the output of the inverter 412 also provides an output signal OUT of the ring oscillator, providing the recovered clock signal. However, in alternative embodiments this output signal OUT could be provided by any node of the ring oscillator 402.

The feedback node provided by the output of the inverter 412 is also coupled to an input of a sequence 413 of further inverters. In the example of FIG. 4, there are N further inverters, where N is the same number as for the ring oscillator 402. Thus in the example of FIG. 4, there are five further inverters 414 to 422 in the sequence 413. The output of the inverter 420 for example provides a second phase signal $\phi 2$. However, in alternative embodiments, there could be fewer than N further inverters in the sequence 413.

Any phase difference between the phase signals $\phi 1$, $\phi 2$ for example results from the input signal injected on the line 402. Thus, in the absence of a signal injected on the input line 403, the phase signals $\phi 1$ and $\phi 2$ are for example in phase. Therefore, if the phase signal $\phi 1$ is generated in the ring oscillator 402 after a delay, introduced by M inverters, of the feedback signal at the output of the inverter 412, the phase signal $\phi 2$ is similarly generated by M further inverters of the sequence 413 receiving the feedback signal at the output of the inverter 412. The number M could be any integer equal to three or more.

The further inverter 422, which for example serves to balancing the loading of the phase signal $\phi 2$ with the loading of the phase signal $\phi 1$, is optional.

A control circuit 424 receives the phase signals $\phi 1$ and $\phi 2$, and generates a control signal VCTRL for controlling the oscillation frequency of the ring oscillator 402 based on a relative phases of the signals $\phi 1$ and $\phi 2$, in other words the sign of the phase difference between the phase signals $\phi 1$ and $\phi 2$. In some embodiments, the control signal VCTRL is also used to control a phase delay introduced by the further inverters 413. For example, the control signal VCTRL modifies the oscillation frequency of the ring oscillator 402 by controlling one or more of the inverters 404 to 412 to introduce a phase delay, and also controls one or more of the further inverters 414 to 422 to introduce the same phase delay.

The inverter 404 of the ring oscillator 402 is illustrated in more detail in FIG. 4. As illustrated, the inverter 404 is for example formed of a PMOS transistor 426 and an NMOS transistor 428 coupled in series by their main conducting nodes between the supply voltage rail VDD and ground. The gates of the transistors 426, 428 are coupled to an input of the inverter 404, and the drains of the transistor 426, 428 are coupled to the output of the inverter 404. The transistors 426, 428 for example have back gates allowing a voltage to be applied. The transistors are for example SOI (silicon on insulator) devices, such as FDSOI (fully depleted SOI) devices. The control voltage VCTRL is for example applied to one or both of the back gates of transistors 426, 428 in order to adjust the delay time of the inverter 404, and thus modify the oscillation frequency of the ring oscillator. All of the inverters of the ring oscillator 402 can for example be controlled in this manner. Alternatively, it may be sufficient in some cases for one or a few of the inverters of the ring oscillator to be controllable in this manner.

Rather than using a transistor back gate to adjust the oscillation frequency of the ring oscillator 402, other techniques would be possible. For example, a transistor could be coupled in series between one or more pairs of adjacent inverters in the sequence and controlled by the voltage VCTRL in order to adjust the RC (resistance capacitance) value at these nodes, and thereby adjust the time constant for charging the node and switching the state of the subsequent inverter.

As a further example, a technique of current starving could be applied to one or more of the inverters of the ring oscillator. This involves coupling the source of the PMOS transistor of the inverter to the VDD supply rail via the main conducting nodes of a further PMOS transistor and/or coupling the source of the NMOS transistor of the inverter to the ground rail via the main conducting nodes of a further NMOS transistor. The further PMOS and/or NMOS transistors are controlled by the voltage VCTRL in order to adjust the current sourcing capabilities of the inverters.

In operation, if there is no injection signal IN, or if the ring oscillator 402 is oscillating at the same frequency as the input signal IN, there will be negligible phase difference between the signals φ1 and φ2. However, if the ring oscillator 402 is oscillating at a frequency different to the reference clock frequency IN, the injection of the signal IN will lengthen or shorten the delay of the inverter 406. This change will impact the phase signal φ1 in an nth cycle of the ring oscillator 402, but it will impact the phase signal φ2 only in an (n+1)th cycle. Therefore, if the input signal IN is attempting to modify the phase of the ring oscillator 402 towards the desired level, the phase signal φ2 will remain in front or delayed with respect to the phase signal φ1. The control circuit 424 for example detects the relative phases of the signals φ1 and φ2 in order to generate the control voltage VCTRL for controlling the oscillation frequency of the ring oscillator 402. It will be noted that the control loop provided in the circuit of FIG. 4 will work even when the ring oscillator 402 is locked to the frequency of the input signal IN.

While in FIG. 4 specific examples have been provided of where in the ring oscillator 402 and further inverter sequence 413 the reference clock signal IN is injected, where the feedback signal is taken, where the output signal OUT is provided, and where the phase signals φ1, φ2 are generated, it will be apparent to those skilled in the art that alternatives would be possible. For example, the phase signals φ1 and φ2 could be provided by any corresponding points in the ring oscillator 402 and the inverter sequence 413. Furthermore, in some embodiments, the signal OUT of the ring oscillator and/or the feedback signal provided to the inverters 404 and 414 are provided by a different inverter to the one providing the phase signal φ1 in order to avoid loading the phase signals φ1 and φ2 in a different manner. However, in alternative embodiments, it may be acceptable to have a loading mismatch, or one or more capacitors could be used to balance the loading.

Figure 5:
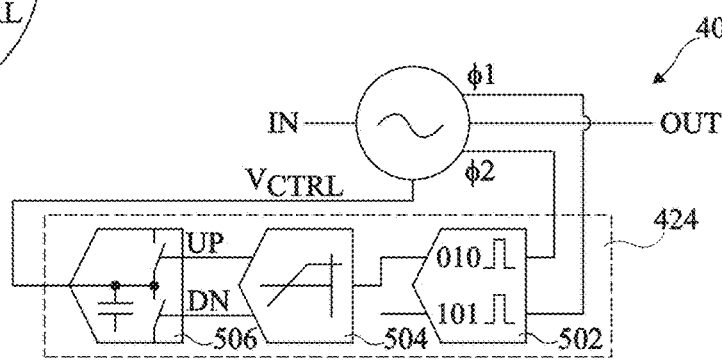
FIG. 5 schematically illustrates a control circuit of the circuit of FIG. 4 in more detail according to an example embodiment of the present disclosure.

FIG. 5 illustrates the clock receiver 400, and in particular the control block 424, in more detail. As illustrated, the control block 424 for example comprises an early-late detector 502 that receives the phase signals φ1 and φ2. The early-late detector 502 for example outputs a high pulse if there is a first sign of phase difference between the phase signals φ1, φ2, and a low pulse if there is a second sign of phase difference between the phase signals φ1, φ2. The phase difference for example has a positive sign when an edge of the phase signal φ2 arrives after an edge of the phase signal φ1, and a negative sign when an edge of the phase signal φ1 arrives after an edge of the phase signal φ2.

The output of the early-late detector 502 is for example coupled to a low pass filter 504. The low pass filter 504 for example filters out alternating changes in the output of the early-late detector. Indeed, in some embodiments, when the phase signals φ1, φ2 are in phase and so no correction is required, the early-late detector 502 is configured to generate an alternating output signal, and this frequency is filtered output by the filter 502. However, in some embodiments, the filter 504 could be omitted.

The output of the low pass filter 504 is coupled to a charge pump 506 for generating the control voltage VCTRL. For example, the charge pump comprises a capacitor. The filter 504 for example generates output signals UP and DN, and the capacitor of the charge pump is for example charged when the UP signal is asserted, and discharged when the DN signal is asserted.

Figure 6:
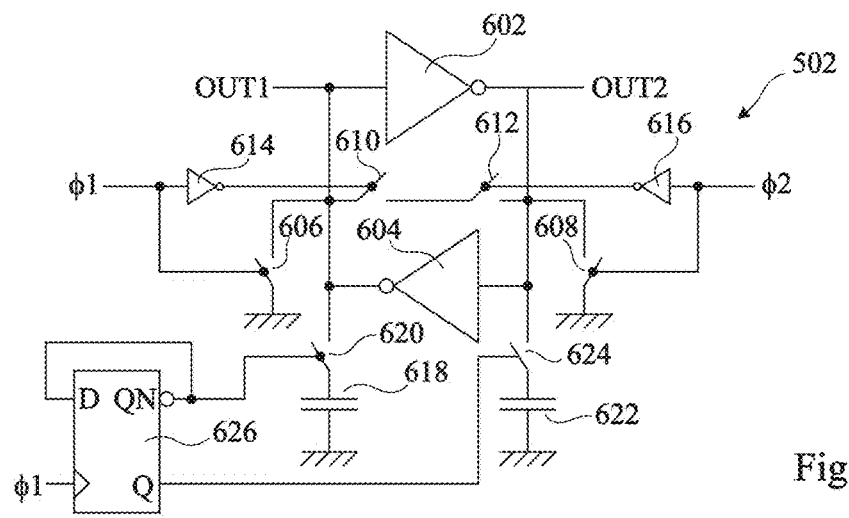
FIG. 6 schematically illustrates an early-late detector of the circuit of FIG. 5 in more detail according to an example embodiment.

FIG. 6 illustrates the early-late detector 502 in more detail according to an example embodiment. The early-late detector 502 example comprises a bi-stable storage circuit formed of a pair of inverters 602 and 604 cross-coupled between output nodes OUT1 and OUT2 of the early-late detector 502.

The output node OUT1 is coupled to ground via a switch 606, and the output node OUT2 is coupled to ground via a switch 608. These switches 606 and 608 are respectively controlled by the phase signals φ1 and φ2. Furthermore, the output nodes OUT1 and OUT2 are coupled together by the series connection of a pair of switches 610 and 612. It is assumed that the switches 606, 608, 610 and 612 are rendered conductive by a high level of the applied control signal, and rendered non-conductive by a low level of the applied control signal. For example, the switches are based on NMOS transistors. However, in alternative embodiments the inverse could be true.

The switch 610 is controlled based on the phase signal φ1. For example, an inverter 614 is coupled between the line providing the phase signal φ1 and the control node of the switch 610. Similarly, the switch 612 is controlled based on the phase signal φ2. For example, an inverter 616 is coupled between the line providing the phase signal φ2 and the control node of the switch 612. In alternative embodiments, the switches 606 and 608 could be replaced by a single switch controlled by a NOR gate receiving at its inputs the phase signals φ1 and φ2.

Optionally, an unbalancing circuit is provided for unbalancing the bi-stable circuit of the early-late detector. In particular, when the phase signals φ1 and φ2 are in phase, the unbalancing circuit for example causes the output of the early-late detector 502 to alternate between high and low states. The unbalancing circuit for example comprises a capacitor 618 coupled to the output node OUT1 via a switch 620, and a capacitor 622 coupled to the output node OUT2 via a switch 624. The capacitors 618 and 622 are for example coupled to ground. The switches 620 and 624 are for example activated on alternate periods. For this, the switch 620 is for example controlled by the inverse output QN of a flip-flop 626. The flip-flop 626 has its inverted output QN coupled to its data input D. The switch 624 is for example controlled by the Q output of the flip-flop 626. The flip-flop 626 is for example clocked by the phase signal φ1, although in alternative embodiments it could be clocked by the phase signal φ2. Thus, on even periods of the phase signal φ1, the switch 620 will be conducting, and on odd periods of the phase signal φ1, the switch 624 will be conducting. The additional capacitance at the node OUT1 or OUT2 will delay the charging of that node, such that the bi-stable circuit is more likely to go to the state in which that output node is at the high voltage state.

The capacitances of the capacitors 618 and 622 are for example relatively low, for example substantially equal to 1 fF.

Operation of the circuit FIG. 6 will now be described in more detail with reference to FIG. 7.

Figure 7:
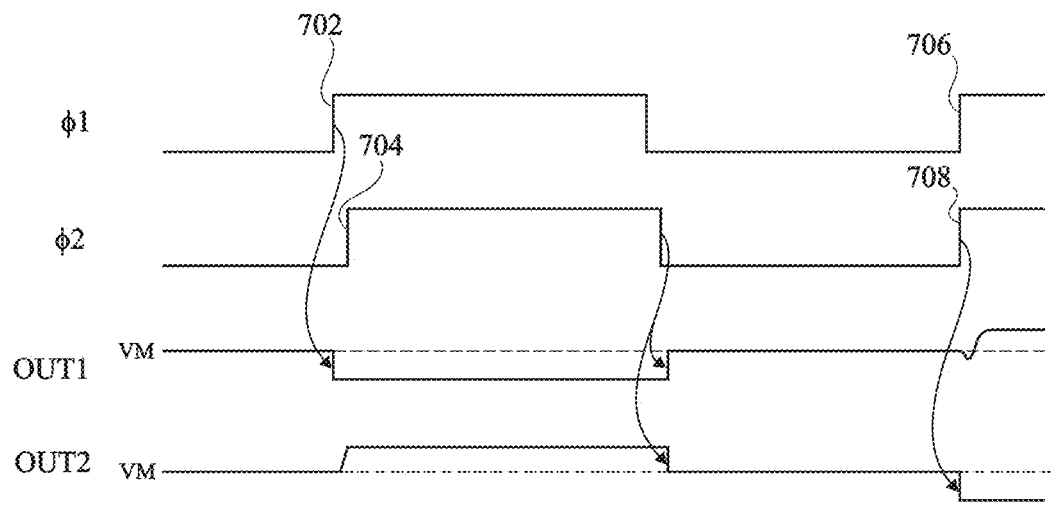
FIG. 7 is a timing diagram illustrating signals in the circuit of FIG. 6 according to an example embodiment.

FIG. 7 is a timing diagram illustrating examples of the phase signals φ1, φ2 and of the output signals OUT1 and OUT2 of the early-late detector.

Initially, both of the phase signals φ1, φ2 are low, and thus the outputs OUT1 and OUT2 are coupled together by the switches 610, 612. The voltages at these nodes are thus at an intermediate level VM.

In a first example in FIG. 7, the phase signal φ1 has a rising edge 702 arriving before a rising edge 704 of the phase signal φ2. The rising edge 702 opens the switch 610, and closes the switch 606, such that the voltage OUT1 is brought towards the ground level. This causes the voltage OUT2 to go to the supply voltage level. The arrival of the rising edge 704 of the phase signal φ2 can no longer change the state of the bi-stable circuit. When the phase signals φ1, φ2 go low, the output voltages OUT1 and OUT2 are reset by the switches 610, 612 to the intermediate level VM.

In a second example in FIG. 7, the phase signals φ1 and φ2 are in phase, and thus have rising edges 706, 708 arriving at the same time. In this example, the switch 620 is for example conducting, and thus the fall of the voltage at the output voltage OUT2 to ground is faster than for the output voltage OUT1. The output voltage OUT1 thus goes high, and the output voltage OUT2 goes low.

Thus it can be seen that the series connection of the switches 610 and 612 respectively controlled based on the phase signals φ1 and φ2 permits the metastable state of the latch formed by the inverters 602, 604 to be released by whichever of these signals arrives first. Thus the detector 502 has low susceptibility to mismatch induced by process variations.

Figure 8:
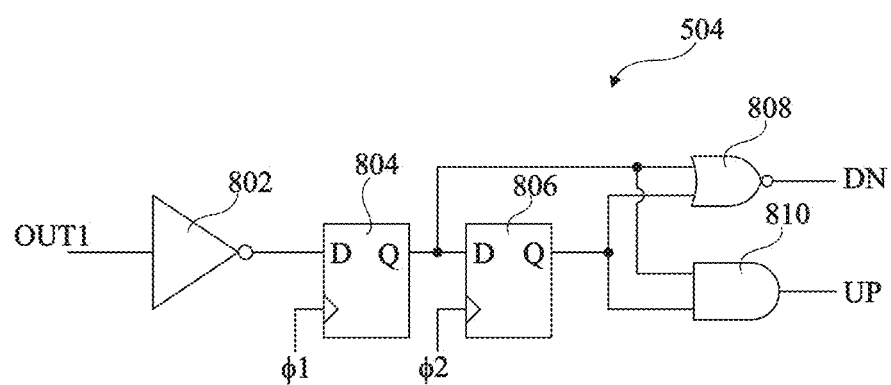
FIG. 8 schematically illustrates a low pass filter of the circuit of FIG. 5 in more detail according to an example embodiment.

FIG. 8 illustrates the low pass filter 504 in more detail according to an example embodiment. The filter for example only receives the signal OUT1 of the early-late detector. Alternatively, it could receive only the signal OUT2.

The signal OUT1 is coupled by an inverter 802 to a series connection of flip-flops 804 and 806. The flip-flop 804 receives at its clock input the phase signal φ1. The flip-flop 806 receives at its clock input the phase signal φ2. The choice of driving one flip-flop using the phase signal φ1 and the other using the phase signal φ2 is for example for load balancing reasons, and in alternative embodiments both flip-flops 804, 806 could be clocked by one or the other of the phase signals φ1, φ2. The output of the flip-flop 804 is coupled to the data input of the flip-flop 806, and also to one input of a NOR gate 808, and to one input of an AND gate 810. The output of the flip-flop 806 is coupled to the other input of NOR gate 808 and to the other input of the AND gate 810. The NOR gate 808 provides the control signal DN to the charge pump 506, while the AND gate 810 provides the control signal UP to the charge pump 506.

In operation, the signals DN and UP are only activated when the outputs of the flip-flops 804 and 806 are at the same state. Thus when the output signal OUT1 alternates between high and low levels on successive periods of the phase signal φ1, neither of the signals UP and DN will be asserted.

It will be apparent to those skilled in the art how the low pass filter of FIG. 8 could be extended using one or more additional flip-flops to also filter out cases in which the sign of the phase difference stays the same for only two or for only three successive periods.

An advantage of the embodiments described herein is that phase information can be extracted and used to modify the oscillation frequency of a ring oscillator in a simple and power efficient manner.

The early-late detector as described herein in relation to FIG. 6 provides the advantage of having a particularly high speed of operating, for example permitting the sign of the phase difference to be detected for phases differences of 2 ps or less between the phase signals φ1, φ2.

Having thus described at least one illustrative embodiment, various alterations, modifications and improvements will readily occur to those skilled in the art.

For example, it will be apparent to those skilled in the art that embodiments have been described based on MOS transistors, alternative embodiments could at least partially be based on other transistor technologies such as bipolar technology.

Furthermore, it will be apparent to those skilled in the art how the positive supply rail and ground rail in the various embodiments could be exchanged with each other, and that rather than a ground voltage, a different supply voltage level could be used, such as a negative voltage.

Furthermore, it will be apparent to those skilled in the art that the various features described in relation to the various embodiments could be combined, in alternative embodiments, in any combination.

The invention claimed is:

1. A clock receiver comprising:
a ring oscillator adapted to generate a clock signal, the ring oscillator comprising a sequence of N inverters, where N is an odd integer equal to 3 or more, an input of a first inverter of the ring oscillator being coupled to a feedback node of the ring oscillator, an input of a second inverter of the ring oscillator being connected to an output of the first inverter and to an input line for receiving a reference clock signal, and an output of the second inverter or of a third inverter of the sequence providing a first phase signal;
a further sequence of two or more further inverters, an input of a first further inverter being coupled to the feedback node of the ring oscillator, and an output of another further inverter of the further sequence providing a second phase signal; and
a control circuit comprising a phase comparator receiving the first and second phase signals and adapted to control a phase delay introduced by the sequence and the further sequence of inverters based on the relative phases of the first and second phases signals for adjusting an oscillation frequency of the ring oscillator.

2. The clock receiver of claim 1, wherein the control circuit is adapted to control the phase delay introduced by the sequence and the further sequence of inverters to bring the oscillation frequency of the ring oscillator to the frequency of the reference clock signal.

3. The clock receiver of claim 1, wherein:
the signal at the feedback node is delayed by M inverters of the sequence of N inverters to generate the first phase signal; and
the signal at the feedback node is delayed by M further inverters of the further sequence of inverters to generate the second phase signal.

4. The clock receiver of claim 1, wherein the control circuit comprises an early-late detector comprising:
a bi-stable storage device formed of a pair of inverters cross-coupled between first and second output nodes of the early-late detector;
at least one first switch coupled between the first and second output nodes and controlled based on the first and second phase signals;
a second switch controlled based on the first phase signal and coupled between the first node and a first supply voltage rail; and
a third switch controlled based on the second phase signal and coupled between the second node and the first supply voltage rail.

5. The clock receiver of claim 4, wherein the at least one first switch comprises a pair of first switches coupled in series between the first and second output nodes, a first switch of the pair being controlled based on the first phase signal, and a second switch of the pair being controlled based on the second phase signal.

6. The clock receiver of claim 4, further comprising a circuit for unbalancing the bi-stable storage device comprising a first capacitor selectively coupled to the first node by a fourth switch and a second capacitor selectively coupled to the second node by a fifth switch.

7. The clock receiver of claim 6, wherein the fourth switch is rendered conductive by a first state of the first or second phase signal, and the fifth switch is rendered conductive by a second state of the first or second phase signal.

8. The clock receiver of claim 7, wherein the control circuit further comprises a low pass filter adapted to generate at least one frequency correction signal, wherein the low pass filter is adapted not to generate the frequency correction signal if the early-late detector detects a changing sign of phase difference between the first and second phase signals over consecutive periods of the first phase signal.

9. The clock receiver of claim 1, wherein at least one of the inverters of the ring oscillator comprises a transistor having a back gate, the control circuit adjusting the oscillation frequency of the ring oscillator by controlling the voltage applied to the back gate.

10. The clock receiver of claim 1, wherein the ring oscillator further comprises a transistor coupled by its main conducting nodes between adjacent inverters of the ring oscillator, the control circuit adjusting the oscillation frequency of the ring oscillator by controlling the voltage applied to a control node of the transistor.

11. The clock receiver of claim 1, wherein the ring oscillator further comprises a transistor coupled by its main conducting nodes between a transistor of one of the inverters of the ring oscillator and a supply voltage rail, the control circuit adjusting the oscillation frequency of the ring oscillator by controlling the voltage applied to a control node of the transistor.

12. The clock receiver of claim 1, wherein the frequency of the ring oscillator is controlled by a voltage signal, the control circuit further comprising a charge pump adapted to generate the voltage signal.

13. An optical link comprising:
an optical receiver comprising a first photosensitive device adapted to receive an optical transmission of a data signal; and
the clock receiver of claim 1 comprising a second photosensitive device adapted to receive an optical transmission of the reference clock signal and coupled to the input line.

14. A method of clock reception comprising:
receiving, on an input line, a reference clock signal;
injecting the reference clock signal into a ring oscillator comprising a sequence of N inverters, where N is an odd integer equal to 3 or more, a first of the inverters being coupled to a feedback node of the ring oscillator, the reference clock signal being injected at the input of a second of the inverters of the ring oscillator connected to an output of the first inverter;
generating by the ring oscillator a first phase signal at an output of the second inverter or of a third inverter of the sequence;
generating by a further sequence of two or more inverters, a second phase signal, an input of a first further inverter of the further sequence being connected to the feedback node of the ring oscillator, and an output of another further inverter of the further sequence providing the second phase signal;
comparing, by a phase comparator, the first and second phase signals; and
controlling, by a control circuit, a phase delay introduced by the sequence and the further sequence of inverters based on the relative phases of the first and second phase signals for adjusting an oscillation frequency of the ring oscillator.

15. The method of claim 14, further comprising controlling, by the control circuit, the phase delay introduced by the sequence and the further sequence of inverters to bring the oscillation frequency of the oscillator to the frequency of the reference clock signal.

16. The method of claim 14, wherein:
the signal at the feedback node is delayed by M inverters of the sequence of N inverters to generate the first phase signal; and
the signal at the feedback node is delayed by M further inverters of the further sequence of inverters to generate the second phase signal.

17. The method of claim 14, wherein detecting the relative phases of the first and second phase signals comprises using an early-late detector comprising a bi-stable storage device formed of a pair of inverters cross-coupled between first and second output nodes of the early-late detector to:
render non-conductive, based on the first and second phase signals, at least one first switch coupled between the first and second output nodes;
control a second switch of the early-late detector based on the first phase signal, the second switch being coupled between the first node and a first supply voltage rail; and
control a third switch of the early-late detector based on the second phase signal, the third switch being coupled between the second node and the first supply voltage rail.

18. An early-late detector for detecting the sign of a phase difference between first and second timing signals comprising: a bi-stable storage device formed of a pair of inverters cross-coupled between first and second output nodes of the early-late detector; at least one first switch coupled in series between the first and second output nodes and controlled based on the first and second timing signals; a second switch coupled between the first output node and a first supply voltage rail, the second switch being controlled by the first timing signal; and a third switch coupled between the second output node and the first supply voltage rail, the third switch being controlled by the second timing signal.

19. The early-late detector of claim 18, wherein the at least one first switch comprises a pair of first switches coupled in series between the first and second output nodes, a first switch of the pair being controlled based on the first phase signal, and a second switch of the pair being controlled based on the second phase signal.

20. The early-late detector of claim 18, further comprising a circuit for unbalancing the bi-stable storage device comprising a first capacitor selectively coupled to the first node by a fourth switch and a second capacitor selectively coupled to the second node by a fifth switch.

\* \* \* \* \*